United States Patent
Burssens et al.

(10) Patent No.: US 11,043,629 B2
(45) Date of Patent: Jun. 22, 2021

(54) INTEGRATED MAGNETIC CONCENTRATOR AND CONNECTION

(71) Applicant: MELEXIS TECHNOLOGIES NV, Tessenderlo (BE)

(72) Inventors: Jan-Willem Burssens, Tielt-Winge (BE); Appolonius Van Der Wiel, Duisburg (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 16/575,640

(22) Filed: Sep. 19, 2019

(65) Prior Publication Data
US 2020/0091415 A1    Mar. 19, 2020

(30) Foreign Application Priority Data
Sep. 19, 2018    (EP) ..................... 18195328

(51) Int. Cl.
*H01L 43/04*      (2006.01)
*G01R 33/07*      (2006.01)
(Continued)

(52) U.S. Cl.
CPC .............. *H01L 43/04* (2013.01); *G01R 33/07* (2013.01); *G01R 33/24* (2013.01); *H01L 43/065* (2013.01); *H01L 43/14* (2013.01)

(58) Field of Classification Search
CPC ......... H01L 24/03; H01L 24/13; H01L 24/02; H01L 24/11; H01L 24/16; H01L 27/22; H01L 43/065; H01L 43/14; H01L 2224/0346; H01L 2224/05073; H01L 2224/11849; H01L 2224/0332; H01L 2224/0401; H01L 2224/05657; H01L 2224/05008; H01L 2224/13111; H01L 2224/04042; H01L 2224/05147; H01L 2224/0391; H01L 2224/16245; H01L 2224/0516; H01L 2224/0361; H01L 2224/05655; H01L 2224/02377;
(Continued)

(56) References Cited

U.S. PATENT DOCUMENTS 6,356,068 B1 * 3/2002 Steiner ................. G01R 15/202
                                                                                                      324/117 H
8,169,215 B2 * 5/2012 Kataoka ................. H01L 43/06
                                                                                                      324/251

(Continued)

FOREIGN PATENT DOCUMENTS

CH          702264 A1    5/2011
DE    102004047784 A1    4/2006

OTHER PUBLICATIONS

Qin et al., "Trimetallic NiFeMo for Overall Electrochemical Water Splitting with a Low Cell Voltage", 2018, ACS Energy Lett. 2018, 3, 546-554, published Feb. 2018.*

(Continued)

*Primary Examiner* — Nikolay K Yushin
(74) *Attorney, Agent, or Firm* — Workman Nydegger

(57) ABSTRACT

A semiconductor device includes an electronic circuit, an interconnection contact such as a solder ball, and a plate configured to concentrate magnetic flux to a predetermined area. The plate is electrically conductive, and it is electrically connected to the electronic circuit.

18 Claims, 4 Drawing Sheets

(51) Int. Cl.
  *G01R 33/24* (2006.01)
  *H01L 43/06* (2006.01)
  *H01L 43/14* (2006.01)

(58) Field of Classification Search
  CPC ... H01L 2224/05124; H01L 2224/1148; H01L 2224/0345; H01L 2224/0347; H01L 2224/0566; H01L 2224/05169; H01L 2224/131; H01L 2224/056; H01L 2224/05166; H01L 2924/0014; H01L 2224/03462; H01L 2224/11334; H01L 2924/014; H01L 2924/01026; H01L 2924/00014; H01L 2924/013; H01L 2924/01074; H01L 2924/01047; H01L 2924/01029; G01R 33/07; G01R 33/24; G01R 33/0011
  See application file for complete search history.

(56) References Cited

U.S. PATENT DOCUMENTS

| 2010/0134101 A1 | 6/2010 | Riva et al. |
| 2014/0252593 A1 | 9/2014 | Chen |
| 2016/0322561 A1 | 11/2016 | Kim et al. |

OTHER PUBLICATIONS

Fert et al., "Electrical resistivity of ferromagnetic nickel and iron based alloys", 1976, J Phys. F: Metal Phys., vol. 6. No. 5, pp. 849-871 (Dec. 1976).*

European Search Report from EP Application No. 18195328, dated Dec. 3, 2018.

* cited by examiner

INTEGRATED MAGNETIC CONCENTRATOR AND CONNECTION

FIELD OF THE INVENTION

The present invention relates to the field of integrated circuits. More specifically it relates to integrated circuits with magnetic sensing capabilities.

BACKGROUND OF THE INVENTION

Electronic circuits tend to an increasing level of integration and compactness. Not only the number of active elements is increased, such as transistors, capacitors, etc., but also the functions of these circuits are increasing in number and diversifying. Accordingly, there is a trend of increasing number of functions that an integrated circuit can execute. For example, sensing capabilities can be applied to integrated circuits, which in many cases are combined with other functions such as calibration and compensation, data processing, signal routing, etc.

In some integrated circuit (IC) applications, it is desirable to include magnetic sensing functions, instead of connecting the IC to an external magnetic sensor. These ICs include usually magnetic concentrators (MCs) and sensing elements, embedded therein. The MCs are structures, such as discs, plates or in general planar structures, which can redirect surrounding magnetic flux, due to the materials and the shape of the MC. The flux can in this way be redirected, depending on the shape of the MC and in accordance with the direction and strength of the magnetic field, towards a predetermined region where a sensitive element or elements may be placed, and which gives a measurable response related to the amount of magnetic field flux crossing the sensitive element or elements.

However, MCs need a substantial area in the IC, in order to provide a meaningful flux concentration which can be measured. This is problematic because ICs need to be compact and using specific areas of the IC for magnetic concentration results in an increase of area or thickness of the IC.

The MCs are usually positioned on the device, overlapping some of the active elements but isolated from them in order to reduce EM interference on these elements. However, this reduces flexibility of design, because the MCs are limited to the available area on the device surface, which usually includes other functions and active elements.

SUMMARY OF THE INVENTION

It is an object of embodiments of the present invention to provide a compact semiconductor device including a magnetic concentration system. It is a further object to provide a compact device with integrated magnetic field measurement.

It is an advantage of embodiment of the present invention that the magnetic concentrators do not need a separate area in the circuit different from the area occupied by the electric signal ports of the device.

In a first aspect, the present invention provides a semiconductor device including an electronic circuit, an interconnection contact and a plate configured to concentrate magnetic flux to a predetermined area, the plate being electrically conductive, wherein the plate is electrically connected to the electronic circuit.

It is an advantage of embodiments of the present invention that integration of the device is improved, thus obtaining a highly compact device where a plate can act simultaneously as magnetic concentrator and port for electronic signals.

In some embodiments of the present invention, the present invention not limited thereto, the plate may comprise nickel and iron. For example, the amount of iron may be between 15% and 30%, the rest being nickel, although it may include other materials such as e.g. impurities.

It is an advantage of embodiments of the present invention that good magnetic properties for a magnetic concentrator can be obtained.

Moreover, the magnetic properties can be combined with good mechanical properties for a UBM for improving adhesion of the interconnection contact (e.g. solder ball).

In some embodiments of the present invention, the device further comprises a redistribution layer for making ports of the electronic circuits available at several locations. The plate is electrically connected to the redistribution layer.

It is an advantage of embodiments of the present invention that a seed layer for providing a magnetic concentrator can be re-used as a redistribution layer.

In some embodiments of the present invention, the device comprises a protection layer for protecting the electronic circuit and for mechanically supporting at least a portion of the redistribution layer.

In some embodiments of the present invention, the plate is adapted to serve as diffusion barrier between the electronic circuit and an interconnection contact.

It is an advantage of embodiments of the present invention that the semiconductor device, e.g. the electronic circuit in the device, can be protected from diffusion and oxidation from the exterior and/or the interconnection contact. It is an advantage of some embodiments of the present invention that the plate may act as a magnetic concentrator and simultaneously present advantageous mechanical functionalities, such as diffusion barrier, oxidation barrier, e.g. acting as an under-bump metallization (UBM) layer for solder ball drop. It is an advantage of embodiments that resilience and chemical resistance of the device can be improved.

In some embodiments of the present invention, the device further comprises an interconnection contact, wherein the plate provides an electric path between the interconnection contact and the electronic circuit.

It is an advantage of embodiments of the present invention that magnetic concentration functionalities can be combined in the same plate with electrical and adhesive functionalities, providing magnetic concentration while providing connection and adhesion with an external board, chip or device in general. For example, the interconnection contact may be a solder ball. It is an advantage of embodiments of the present invention that well-known fabrication technologies such as flip chip technology can be used.

In some embodiments of the present invention, the plate includes material from the interconnection contact up to no more than one third of the thickness of the plate.

It is an advantage of embodiments of the present invention that good magnetic properties can be obtained for magnetic flux concentration together with good electric path between the concentrator and the interconnection contact, for example despite presence of intermetallic material in the magnetic concentrator from solder ball reflow.

In some embodiments of the present invention, the device further comprises at least one magnetic field sensing element configured to sense a magnetic flux concentrated by the plate. It is an advantage of embodiments of the present invention that a magnetic sensor can be provided in a very compact integrated circuit or packaged circuit.

In a second aspect, the present invention provides a method of providing a magnetic system on a semiconductor device, the method comprising:

providing, on a substrate, a semiconductor device with an electronic circuit, providing a plate on the substrate, wherein providing the plate comprises configuring the plate to concentrate magnetic flux, wherein providing the plate further comprises electrically connecting the plate with the electronic circuit.

It is an advantage of embodiments of the present invention that integration of the device is improved, thus obtaining a highly compact device where a plate can act simultaneously as magnetic concentrator and port for electronic signals.

In some embodiments of the present invention, the method further comprises providing at least one interconnection contact on a portion of the plate. It is an advantage of embodiments of the present invention that the required area for allowing a conductive path can be provided, while reducing the disturbance of the magnetic properties of the plate due to attachment between the plate and an interconnection contact. For example, the interconnection contact can be provided by providing a masking layer.

In embodiments of the present invention, the method further comprises providing an interconnection contact and electrically connecting the interconnection contact to the plate, for example by abutting the interconnection contact against the plate.

It is an advantage of embodiments of the present invention that an electrical path can be established between the electronic circuit and an external device, board, chip, die, etc. It is a further advantage that, by abutting the contact, highly compact packages can be provided.

In embodiments of the present invention, the method further comprises providing a seed layer on the substrate, subsequently providing the plate on the seed layer, where the seed layer is electrically conductive for electrically connecting the plate to the electronic circuit. It is an advantage of embodiments of the present invention that at least part of the seed layer for providing the plate can be used as a redistribution layer.

In embodiments of the present invention, the method further comprises providing a masking layer at least partially over the substrate, before providing the seed layer and/or before providing the plate.

It is an advantage of embodiments of the present invention that a seed layer and/or a plate layer can be formed easily by using a masking. It is an advantage of some embodiments that the electronic circuit can be protected.

It is a further advantage of embodiments of the present invention that a protection layer can be used as support for a seed layer and remain as support for the redistribution layer, when the protection layer is provided between at least part of the seed layer and at least part of the substrate. It is an advantage of some embodiments that the mask layer for providing shape to the plate can have the function of protecting the device.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
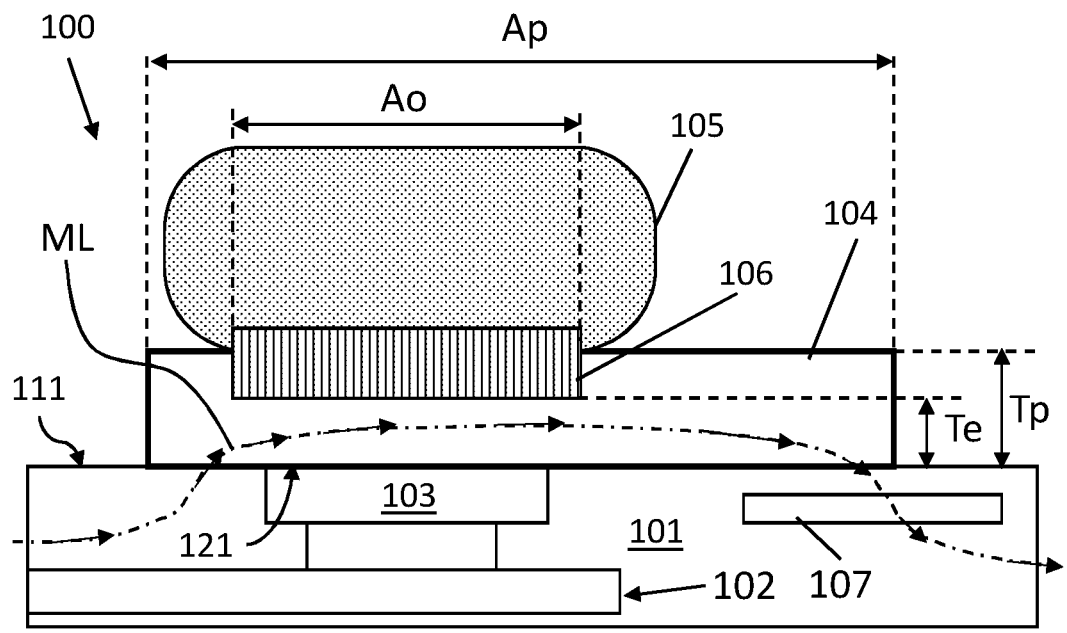
FIG. 1 illustrates a cross section of a device according to embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "interconnection contact" or simply "contact", reference is made to a type of connection used in integrated circuit technology for interchanging electric signals between a chip and a substrate or another chip, through input/output (I/O) ports, including pads or the like. The term "interconnection contact" covers solder balls used in solder bump bonding, bonds in wire bonding, studs, pillars, etc. For example, electrical connections used in flip-chip technology are included as interconnection contacts.

The present invention relates to integrated circuitry with magnetic sensing capabilities, including a semiconductor device with one or more magnetic concentrators (MCs) on top of the substrate of the device. MCs can be considered a plate, in the sense that they usually have planar dimensions, e.g. parallel to the substrate surface, much larger than its thickness.

In order to save space in the area of the circuit, the present invention includes the idea of making at least part of area of the MC available for providing an electric path to I/O ports of the circuit.

More in detail, in embodiments of the present invention, the I/O ports of the device (e.g. the pads of a circuit in a semiconductor substrate) may be in electric contact with a conductive plate, which is used to provide connection to a chip. A conduction path or electric path is provided by the plate between an interconnection contact and the conductive tracks of a device, via a port such as a pad or a redistribution layer and a pad, of the circuit of the device. The plate may act as an adhesion layer for a circuit interconnection contact, and/or as a barrier diffusion layer for protecting conductive tracks of the device from phenomena such as diffusion and electro-migration, and/or oxidation barrier, and/or as a wetting layer for improving adhesion to the interconnection contact. In particular, the plate may act as an under-bump metallurgy (UBM) layer, which presents all of these advantageous properties. For example, the UBM layer can be used as solder ball drop. The present invention includes using the same plate as a magnetic concentrator MCs. Thus, the MC acts as barrier layer for the interconnection contact, e.g. as UBM layer for the ball drop. Integration and compactness of the IC is improved.

In a first aspect, the present invention relates to a device, more particularly a semiconductor device, such as an integrated circuit in a chip, die, substrate, etc.

The device includes a plate configured to redirect magnetic flux and concentrate magnetic flux towards a predetermined area. The plate may comprise soft magnetic materials, and it may be shaped to redirect magnetic flux to a predetermined zone of the device. The plate of the present invention is electrically connected to the device. The plate may be electrically conductive and it may provide a path for electric signals to be exchanged with the device.

In embodiments of the present invention, the device includes a port for input and output of electric signals, and the plate may provide an electric path between the port and an external contact, for example an interconnection contact (e.g. a solder ball), for example the plate may provide an electric path between the device and a lead frame (for example, in a packaged chip), and/or any other device, die, or chip. In embodiments of the present invention, the device also includes such interconnection contact.

The plate can be adapted to act as oxidation barrier, and/or, especially in the case where a solder ball is provided, as a diffusion barrier layer, for reducing or avoiding diffusion of material from the solder ball into the port and/or conductive tracks of the semiconductor device. For example, the dimensions and composition of the plate may be adapted to obtain good diffusion barrier properties.

In embodiments of the present invention, the device may include a sensing element for sensing magnetic field concentrated by MCs. The device may comprise any circuit that may utilize magnetic measurements, such as magnetic sensors, for example a circuit including an electronic compass, where the available area is limited (e.g. an electronic compass may be included in a die of the order of 1 mm$^2$).

FIG. 1 shows a lateral cross section of a semiconductor device 100 in accordance with a simple embodiment of the present invention. The device 100 may be a semiconductor device, a wafer die, for example a chip, including a semiconductor substrate 101 (e.g. a Si substrate, Si—Ge, SOI, etc) and an electronic circuit 102. The surface 111 of the substrate 101 includes an opening 121 for a pad acting as a port 103, for exchanging electric signals (introducing signals in the port, and/or outputting signals from the port) with the device 100, specifically with its electronic circuit 102. The substrate 101, circuit 102 and port 103 (such as a pad) can be obtained in accordance with known manufacturing techniques.

The port 103 is in electric contact with a plate 104. In FIG. 1, the plate 104 acts as a barrier, e.g. a barrier against oxidation of the port 103 and against diffusion of material from an interconnection contact 105 to the port 103. In particular embodiments, the plate 104 may be a UBM layer. In some embodiments of the present invention, the plate 104 is attached to the port 103, and it can also provide good adhesion to a solder ball or bump acting as interconnection contact 105. The plate 104 is conductive, in order to allow transmitting electric signals between the interconnection contact 105, e.g. solder ball, and the circuit 102, through the pad acting as a port 103.

Moreover, the plate 104 is further shaped and adapted so that it allows redirecting and concentrating magnetic field, represented by dashed/dotted magnetic field lines ML with arrows, towards a predetermined region suitable for including a sensing element 107 for measuring magnetic field flux. The semiconductor device may include magnetic sensing capabilities, e.g. it is suitable for obtaining a signal representative of a magnetic field such as Hall sensors. The semiconductor device may include additionally or alternatively other devices with functionalities that utilize magnetic field concentration, such as for example an integrated inductance. The plate 104 has functionality of a barrier, and also the functionality of a MC.

In embodiments of the present invention, the plate 104 comprises materials that contribute to redirection and concentration of magnetic flux. For example, soft magnetic materials can be used. The plate may comprise for example cobalt, nickel, iron, etc, for example, cobalt-iron alloys, or nickel-iron alloys, e.g. containing 15% to 30% iron. For example, the plate may include a $Ni_{80}Fe_{20}$ alloy. In particular, Ni—Fe alloys can be advantageously used on a silicon substrate 101, because their thermal expansion coefficients are similar, so the device 100 is subjected to less thermal stress during fabrication and use. These materials are also compatible with lead-free soldering material, which are typically used as interconnect contact 105, but which react fast and dissolve other materials typically used as contact pads or UBM layers, such as copper.

In embodiments of the present invention, the plate 104 may have such thickness that magnetic saturation effects are reduced or avoided. While a traditional UBM layer has a thickness of 2-5 microns or up to 7 to 10 microns, the plate 104 may have a thickness between 10 μm and 150 μm, for example between 20 μm and 100 μm, for example 30 μm.

In embodiments of the present invention, the plate 104 serves as ball drop for a solder ball acting as interconnection contact 105. In some embodiments, the interconnection contact 105 may be included in the device 100. The contact 105 may for example include Sn, for example a Sn-based alloy, and it may present good solderability and mechanical properties, which can be tailored by addition of other metals. For instance, Sn-based solder bumps including an Ag content of more than 3% perform better in thermal fatigue testing and are more resistant to shear plastic deformation, while alloys with lower Ag content (around 1%) exhibit superior ductility and therefore better fatigue endurance under severe strain conditions. Furthermore, a mere 0.5% of Cu can decrease the dissolution behavior of substrate Cu, thus increasing solderability. For example, the solder ball may comprise or consist of a so-called near-eutectic Sn—Ag—Cu alloy.

The plate 104 and the interconnection contact 105 may show good adhesion as well as good conductance. For example, ball reflow or analogous treatments can be provided to obtain good adhesion. However, although the adhesion between the plate 104 and the contact 105 improves, the treatments may generate a layer 106 of intermetallic materials in the boundary between the plate 104 and the contact 105. In particular examples, the plate 104 may include Ni, and the ball (acting as contact 105) may include the materials presented earlier, but not limited to these, so the ball may include Cu, Cu alloys, Sn, Sn alloys, etc. For example, in case Sn alloys are included in the contact 105, a NiSn intermetallic layer 106 may form during ball reflow. This layer 106 usually presents magnetic properties different from the rest of the plate, and can change the behavior of the system, e.g. during aging, solder reflow, etc. In general, the presence of the layer 106 deteriorates the soft magnetic properties of the plate. In preferred embodiments, the plate/contact overlap area, represented by its side dimension Ao, is small enough with respect to the total area of the plate, represented by the side dimension Ap of the plate area, so that any worsening of the flux concentration can be neglected, by allowing the magnetic concentration to be performed by a largely undisturbed area of the plate 104. For example, the plate/contact overlap area may be less than 50% of the area of the plate. However, the present invention is not limited thereto, and more than 50% of the area may be overlapped, for example the whole area. In such cases, the thickness of the plate (e.g. 30 μm or more) may improve magnetic concentration.

Alternatively, or additionally, the thickness "Te" of the plate not including the intermetallic layer 106 may be enough to provide good magnetic concentration and low saturation. For example, this thickness Te may be ⅔ of the total plate thickness Tp. For example, the intermetallic layer 106 may occupy a maximum of ⅓ or the thickness of the plate.

In embodiments of the present invention, the whole plate 104 comprises soft magnetic materials. For example, the plate 104 may be a homogeneous soft magnetic alloy plate, e.g. a homogeneous Ni—Fe alloy plate. This has the advantage of a simple manufacture and very low profile, improving integrability.

However, the present invention is not limited to this, and the plate may include multiple layers with different compositions. For example, the plate 104 may have a portion Te of its thickness with a homogenous composition, while a small amount of its total thickness Tp includes a layer 106, e.g. the intermetallic layer 106 previously discussed. In other embodiments, the plate may include a bottom layer in physical contact with, e.g. abutting against, the port 103 (e.g. the pad) including materials that allow good attachment to the port 103. It may also include a top layer suitable for being abutted, and attached, to an interconnection contact 105 (e.g. a solder ball). An intermediate layer may be included between the top and bottom layer. For example, one of the layers (e.g. the intermediate layer) may include soft magnetic materials. For example, in some embodiments, the multiple layers of the plate 104 may have a thickness such that good flux concentration and low saturation can be provided. For example, the top layer may be thick enough so the interlayer 106 does not reach the intermediate layer including soft magnetic materials.

In some embodiments of the present invention, the known issue of Cu consumption by lead-free solder is solved by using the magnetic concentrator as UBM. The materials of the plate, e.g. Ni and/or Co in the plate 104, function as a barrier, instead of Cu. This prevents rapid dissolution of the UBM into lead-free solder. It also prevents dissolution of Cu present e.g. in the ports 103.

In embodiments of the present invention, the plate 104 may act as an integrated magnetic concentrator (IMC) for converting an external magnetic field locally parallel with the chip surface into a field substantially perpendicular to the surface.

Figure 2:
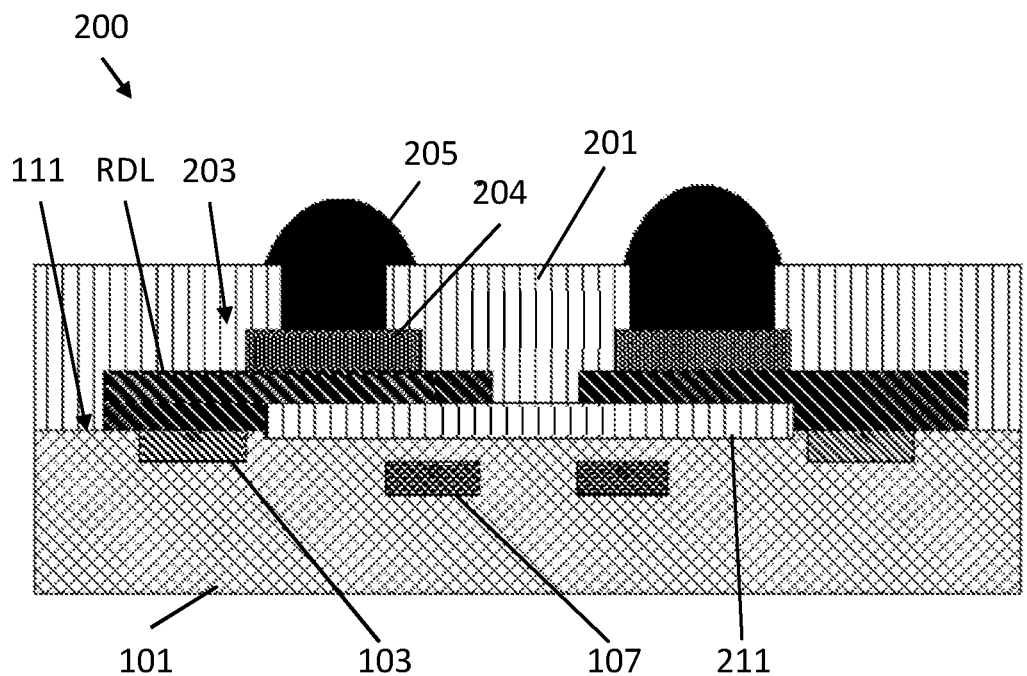
FIG. 2 illustrates a cross section of a device including a redistribution layer, according to alternative embodiments of the present invention.

FIG. 2 shows a cross section of a device 200 in accordance with another embodiment of the present invention. As before, a conductive plate 204 is electrically connected, via a port 103 e.g. a pad, to an electronic circuit (not illustrated) forming part of the device 200. The plate 104 of FIG. 1 may be analogous to the plate 204 of FIG. 2. For example, it may be a NiFe plate. In this latter case, however, the conduction path between the interconnection contact 205 and the electronic circuit (not illustrated) includes a redistribution layer RDL between the port 103 and the plate 204. The conduction path 203 or electric path can be established between the electronic circuit (not illustrated) and the solder 205, which acts as interconnection contact, via the plate 204, the RDL and the port 103.

The presence of a RDL increases design flexibility, because the interconnection contacts 205 can be provided over areas different from those where the ports 103 are included on the device. This allows more homogeneous distribution of multiple MCs, which improves utilization of the device area. This also allows increasing the overall area of each plate, thus potentially improving sensitivity to magnetic field (allowing larger amount of flux to be redirected and concentrated). Moreover, the presence of a RDL increases shielding of the device pad against oxidation or diffusion. The plate 204 would, in this case, abut against the RDL, and may provide the RDL with an oxidation and diffusion barrier, in a similar way as in FIG. 1 with the pad 103.

Moreover, in some embodiments of the present invention, the RDL is further adapted to function as a seed layer for the plate 204 during manufacture of the device. In other words, the seed layer of the MC plate 204 can be re-used as RDL, thus improving compactness of the device and reducing the number of manufacturing steps.

In some embodiments, the RDL has a relative magnetic permeability smaller than 1000, for example smaller than 100, e.g. smaller than 10. For example, the RDL may include copper, aluminum, platinum, metallic alloys such as iron alloys, and the like. For example, the RDL acting as seed layer may comprise TiW, or Cu, or a combination thereof.

In embodiments of the present invention, the RDL may act as a magnetic concentrator, for example the RDL and the MC plate may have the same functionality of concentrating magnetic field. The geometry of the RDL may be adapted, not only for the function of distributing signals, but also for magnetic concentration. These functions are easy to combine for simple geometries of RDL.

In embodiments of the present invention, the seed layer may have a thickness of 0.4 µm.

In embodiments of the present invention, at least one protection layer 201, for example a multi-layer can be included, at least partially covering the substrate 101, e.g. part of the surface 111 of the substrate. The protection layer 201 may be a non-metal layer, e.g. a dielectric layer, for example a layer comprising silicon nitride, or silicon oxide, or silicon carbide, or combinations thereof, or a multi-layered structure. It may be a polymer, e.g. epoxy, BCB, PBO. In particular, a polyimide layer can be provided as a protection layer 201. The layer may provide mechanical and chemical protection to the device.

In some embodiments of the present invention, the protection layer 201 or parts thereof may have alternative or additional uses. For example, it can be used as a masking layer while providing the plate 204, and/or the RDL, and/or the interconnection contacts 205, during device manufacture. FIG. 2 shows for example that one portion 211 of the protection layer 201 may also serve as a support for at least part of the RDL, further isolating that portion of the RDL from the surface 111 of the substrate 101.

In some embodiments of the present invention, the device 100, 200 can include an integrated magnetic sensor by including at least one sensing element 107 for sensing magnetic fields. The sensing element 107 may be for example include Hall plates, for example horizontal Hall plates, although the present invention can be applied to other sensors, e.g. horizontal sensors.

Figure 4:
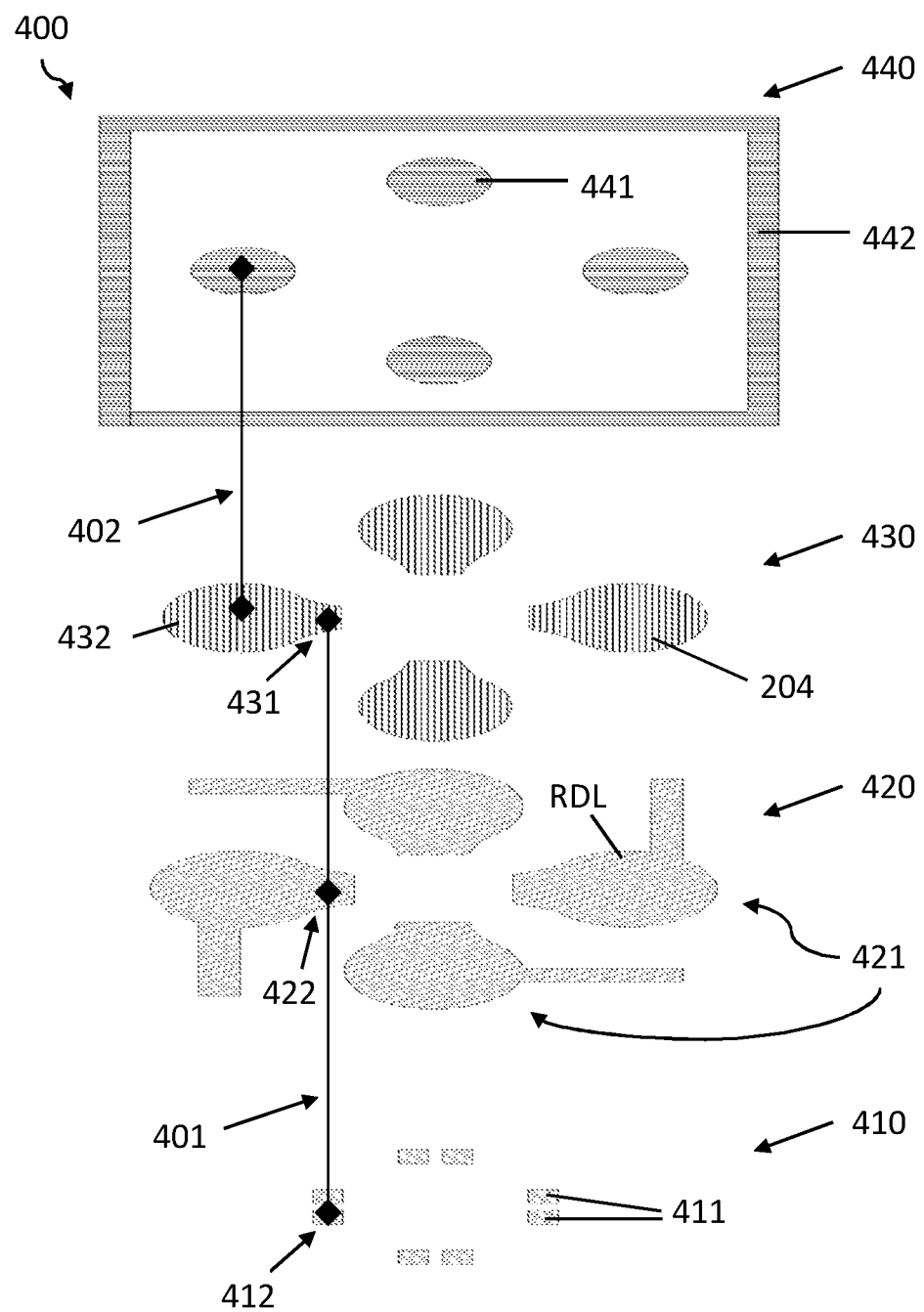
FIG. 4 illustrates the exploded view of a device including a redistribution layer, according to alternative embodiments of the present invention.

The shape of the plate 104, 204 determines the way the magnetic flux concentrates, and can be adapted in accordance with the particular application of the device, and also in accordance with the placement of the sensing element or elements in or on the device. For example, the plate 104, 204 may be a disc, horned disc as shown in FIG. 4, an octagonal plate, etc.

Embodiments of the first aspect of the present invention can be applied to application specific integrated circuits (ASIC), such as Hall ASICs, CMOS Hall ASICs, etc. These embodiments of devices of the present invention can be made very compact.

Figure 3:
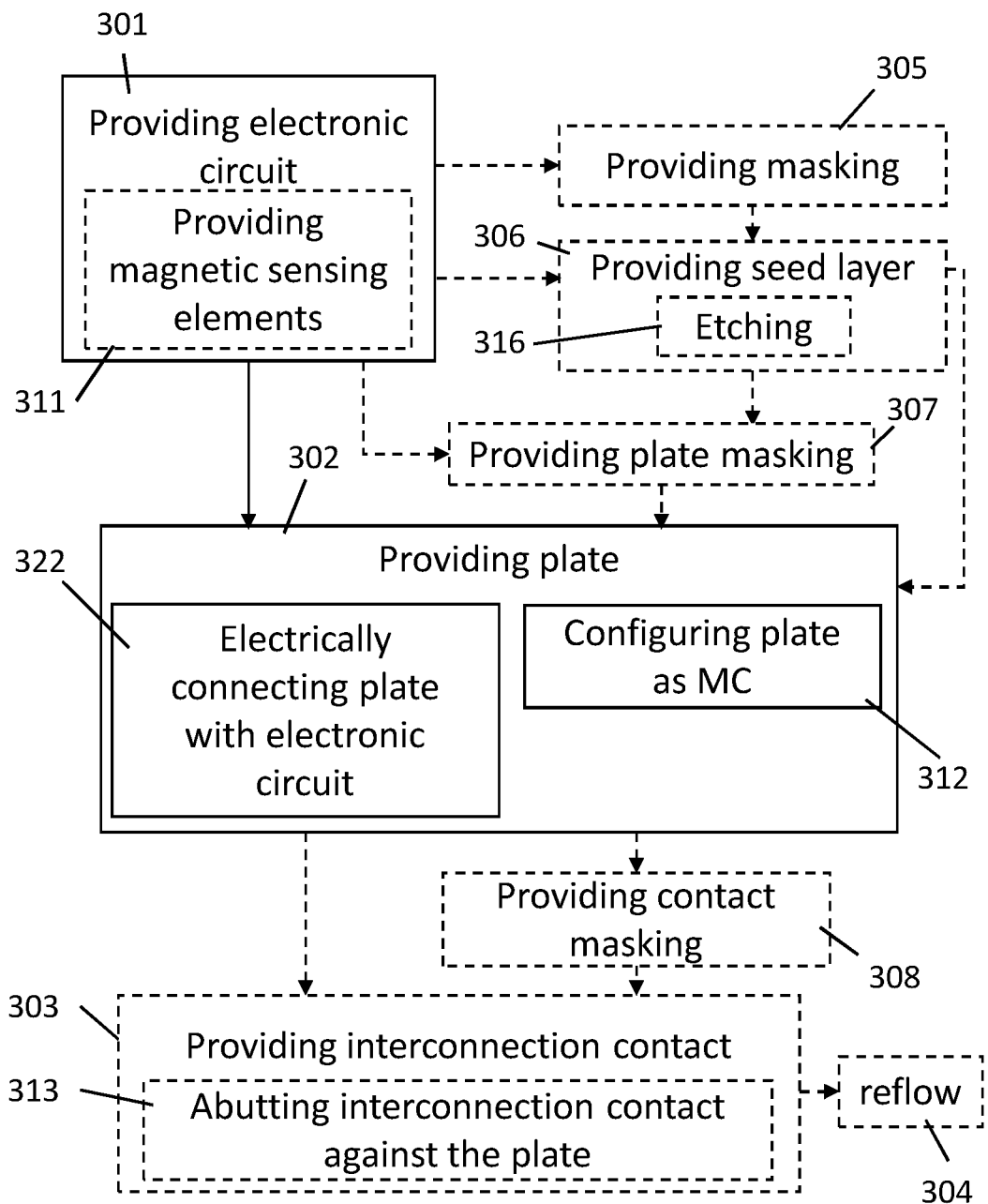
FIG. 3 shows a process flow of a method according to embodiments of the present invention, including optional steps.

In a further aspect, the present invention provides a method of manufacturing a device which comprises an electronic circuit where redirection of magnetic fields is provided. The method, outlined in the scheme of FIG. 3, includes the steps of providing 301, on or in a substrate 101, an electronic circuit; providing 302 a plate 104, 204 and configuring 312 the plate as an MC, and further electrically connecting 322 the plate to the electronic circuit. These latter two steps may be performed simultaneously, by configuring the shape of the MC at the same time as providing electrical connection, thus saving steps in the manufacturing route.

In embodiments of the present invention, the step of providing 301 an electronic circuit may comprise providing an integrated circuit.

In some embodiments, the step of providing 301 an electronic circuit may comprise providing 311 magnetic sensing elements 107 on or in the substrate 101. For example, an electronic circuit with sensing elements, such as Hall plates or the like, may be provided. The magnetic sensing elements may, but do not have to, form part of the electronic circuit, e.g. part of an integrated circuit.

In embodiments of the present invention, the method may further comprise providing 305 a masking layer on the surface 111 of the substrate 101, for providing further layers in subsequent steps. The masking layer could be used for subsequently providing 302 the plate, or alternatively for providing 306 a seed layer. In some embodiments, the masking layer or part thereof can remain on the surface 111 of the device, protecting the device as (part of) a protection layer 201, and/or as a passivation layer or a seal layer.

In embodiments of the present invention, the method may comprise providing 306 a seed layer. This can be performed, for example, using a masking layer obtained in a previous step, optionally followed by an etching step. In other embodiments, providing a seed layer may comprises providing a seed layer on the surface 111 of the substrate without previously providing a masking layer, and shaping the seed layer by etching 316 away the unnecessary parts.

After the seed layer is provided, the method may include subsequently providing 302 the plate, as mentioned earlier. This can be done by any suitable technique, such as for instance sputtering, evaporation, plating or electroplating, printing, vapor deposition techniques, etc.; it may include providing a conductive material, e.g. a metal such as may include providing a soft magnetic material such as a Fe—Ni alloy. The thickness of the plate and other details are described in embodiments of the first aspect of the present invention.

In some embodiments of the present invention, providing 302 the plate may comprise providing 302 the plate in a single deposition step. For example, a plate with a thickness of 130 µm, or lower, for example a thickness of 30 µm, can be obtained in a single step. This is advantageously a very fast and easy way of providing the plate. In some embodiments, providing the plate may optionally comprise providing a multi-layered plate, each layer including materials and configured for a specific purpose. For example, it may include providing a first layer (e.g. on the substrate surface) for improved adhesion, a second layer for magnetic field concentration and a third layer as barrier layer for abutting against an interconnection contact.

In some embodiments, the seed layer may be consumed during or removed after providing 302 the plate. In alternative embodiments, the seed layer does not need to be completely consumed or removed, so at least part of the seed layer can have the role of redistribution layer (RDL). For example, in embodiments of the present invention, providing 306 the seed layer comprises providing a conductive seed layer, shaping it for providing electric signal redistribution, thereby obtaining a redistribution layer RDL. For example, a Cu seed layer can be used as RDL. If a traditional Cu layer was used for solder and ball drop, at least 8 µm thickness should be used, because after reflow about 4 µm of the layer is consumed and dissolved, forming CuSn intermetallics. Providing a thin seed layer for RDL, which also allows manufacturing a relatively thick MC for receiving a solder ball, allows signal redistribution while providing magnetic concentration in the same region of the device.

In some embodiments of the present invention, the method further comprises providing 303 an interconnection contact, and electrically connecting the interconnection contact to the plate. For example, in some embodiments the electrical connection may be provided by abutting 313 the contact against the plate. For example, the interconnection contact may be a solder ball, and the plate may receive the solder ball as a ball drop. In some embodiments, a step of reflowing 304 the ball may be included, by applying a thermal treatment and ensuring adhesion between the interconnection contact and the plate. In particular embodiments of the present invention, the method may comprise providing 308 a masking layer for the interconnection contact, before providing 303 said contact. For example, it may shape the solder 205. However, the step of providing 308 such contact masking layer is optional, and the contact (e.g. the ball) can be directly provided on the plate without masking.

The method of the present invention can be adapted and other steps can be added. For example, instead of solder ball, other connections such as wire bonding can be provided.

The masking layers can be provided 305, 307, 308 by providing an insulating material such as an oxide (e.g. silicon oxides), nitride (e.g. silicon nitride), or polymeric layer (e.g. polyimide layer), as specified in embodiments of the first aspect. These can be provided by any suitable method depending on the materials used, known by the skilled person, e.g. deposition and patterning, etc.

Any or all of the masking layers can act as sacrificial layers and can be removed after their use as a mask. For example, the contact masking layer 201 may be at least partially removed before reflowing 304. In preferred embodiments, at least some of the masking layer may remain and as a protection layer 211 for the device or parts thereof. For example, the contact masking layer 201 may be provided for allowing only a small portion of the plate 204 to abut the interconnection contact 205. This ensures sufficient electrical path between the contact and the plate, while the plate still provides sufficient barrier against diffusion and oxidation of conductive material from the RDL, or the I/O port of the device, in contact with (abutting) the plate. The reduced contact area provided by the masking layer may, in summary, improve the UBM properties, while ensuring also low saturation effects and good magnetic properties for the functions of the plate 204 as MC. Additionally or alternatively, the masking layer may remain as passivation layer. For example, the method may comprise providing a polyimide masking layer for the RDL, providing the RDL, and leaving at least part of the polyimide layer as a protection for the device. The method may further include providing further polyimide layers for the plate and for the contacts, which may stay as protection. The masking layer may also serve as structural support for parts of the device, for example for at least part of the RDL.

FIG. 4 is an exploded view of the different superimposed levels of an exemplary device 400 in accordance with embodiments of the present invention. It shows the relative positions of each element of the layers with respect to each other.

From bottom to top, the first level 410 shows the position of Hall plates 411 in a device according to embodiments of the present invention. Providing 301 the electronic circuit, or more particularly providing 311 magnetic sensing elements, may comprise providing this first level 410.

The second level 420 shows a seed layer 421 for providing a plate on top thereof. A plate will be provided for each couple of Hall plates 411, so the seed layer 421 may comprise multiple regions separated from each other as shown in the figure, one region for each couple of Hall plates. The seed layer 421 remains in the device 400 acting as redistribution layer (RDL). The shape of each RDL may be adapted to provide a connection between a pad on the device (not pictured) and the plate. Accordingly, the level 420 may include a protection layer 211, e.g. polyimide layer, for shaping the RDL, and/or for protecting the device and in some embodiments even for supporting the RDL and separating it from the surface of the device away from the port.

The full RDL could be used as a seed layer, or optionally only part of it when using a mask, allowing flexibility on the design of the RDL, e.g. in combination with an optional mask for forming the plate used as MC.

The third level 430 shows the plate 204 acting as IMC, which in the present invention has the same functions as a UBM layer for receiving an interconnection contact. The shape of the IMC/UBM plate is adapted to provide desired magnetic properties, such as measurement of orthogonal magnetic field components, cross coupling between said fields, saturation effects, redirection of the fields towards a predetermined region, etc. The typical thickness of an IMC is 30 micrometers while the typical thickness of a UBM is 2-5 micrometers. The increased thickness of the plate in embodiments of the present invention allows reducing or avoiding magnetic saturation effects.

The shape of the plate 104, 204 is driven by the magnetic performance for providing a good MC (e.g. IMC), which might differ from the ideal UBM layout. In order to improve the UBM layout, so the function of the plate as UBM is improved, a mask 441 can be applied 308 to the IMC leaving openings exposing predetermined portions of the plate 204 for providing good barrier properties to protect the conductive material abutting the plate (thus improving the behaviour as UBM), as described earlier.

The fourth level 440 shows such masks 441 used in an embodiment of the present invention for limiting the area of the plate abutting the interconnection contact. For example, it may include a plurality of solder masks 441 and a mask 442 for a lead frame.

The lower vertical black 401 line shows, at its square points, the region 422 of the RDL and the region 431 of the plate which coincide with, and superpose, one Hall plate 412. The upper vertical black line 402 shows, at its points, where the mask 441 for the interconnection contact coincides with one plate 432 of the plate layer 430.

Figure 5:
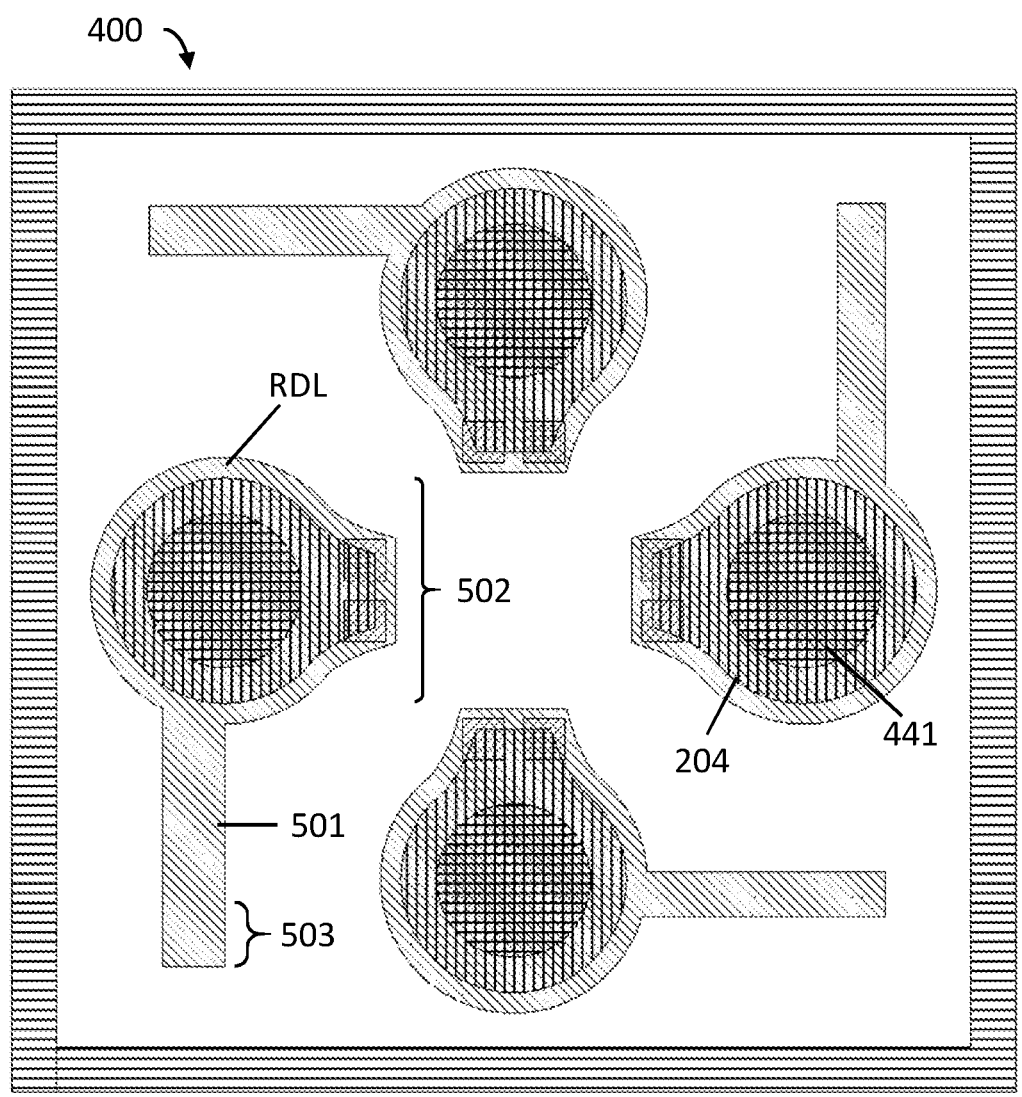
FIG. 5 illustrates the top view of the device of FIG. 4.

FIG. 5 shows a top view of the exemplary device 400 of FIG. 4, with the levels 410, 420, 430, 440 superposed on top of each other. The mask 441 provides substantially smaller contact area than the whole plate area of the plate 204, improving the barrier properties and allowing good magnetic properties, e.g. limiting the presence of an intermetallic layer 106 as explained with reference to FIG. 1.

The arms 501 of the RDLs show an example of redistribution of the electric signal on the device 400. For instance, the arm comprises a proximal extreme including the area 502 where the plate 432 overlaps, and a second distal extreme 503 opposite to the proximal extreme. The distal extreme 503 may include a connection to a port of the device (not pictured in FIG. 4 or FIG. 5, but pictured as port 103 in FIG. 2). Thus, higher flexibility of design can be obtained. A wide area of plate 204 can be used for MC, with a great freedom for positioning the plates without disturbing any nearby connection. Also, the positioning of the MCs can be adapted to the position of Hall plates. Moreover, a conductive path can be provided on the plate itself, which can be redirected to any position on the device where the signal ports are provided.

In summary, the present invention advantageously saves area on a semiconductor device by combining a plate as MC and as metallization layer for receiving an external contact, e.g. as UBM layer. This also saves a step during device manufacture.

Chip size can be scaled down, because the conflict between the location of the magnetic concentrators and the location of the solder balls is resolved.

Further, a seed layer, such as a sputtered seed layer, can be structured to function both as a plating base and as RDL, also saving space and a manufacturing step, and improving circuit design flexibility.

The invention claimed is:

1. A semiconductor device including:
   an electronic circuit;
   an interconnection contact; and
   a plate configured to concentrate magnetic flux to a predetermined area, the plate being electrically conductive;
   wherein the plate is electrically connected to the electronic circuit and provides an electric path between the interconnection contact and the electronic circuit.

2. The device of claim 1, wherein the predetermined area is suitable for including a sensing element for measuring magnetic field flux.

3. The device of claim 1, wherein the plate is adapted to serve as diffusion barrier between the electronic circuit and the interconnection contact.

4. The device of claim 1, wherein the interconnection contact is a solder ball.

5. The device of claim 1, wherein the plate includes material from the interconnection contact up to no more than one third of a thickness of the plate.

6. The device of claim 1, further comprising at least one magnetic field sensing element configured to sense a magnetic flux concentrated by the plate.

7. The device of claim 1, wherein the plate comprises nickel and iron.

8. The device of claim 7, wherein an amount of iron falls between 15% and 30%.

9. The device of claim 1, further comprising a redistribution layer for making ports of the electronic circuits available at other locations, wherein the plate is electrically connected to the redistribution layer.

10. The device of claim 9, further comprising a protection layer for protecting the electronic circuit and for mechanically supporting at least a portion of the redistribution layer.

11. A method of providing a magnetic system on a semiconductor device, the method comprising:
   providing, on a substrate, a semiconductor device with an electronic circuit;
   providing a plate on the substrate, wherein providing the plate comprises configuring the plate to concentrate magnetic flux; and
   providing an interconnection contact and electrically connecting the interconnection contact to the plate;
   wherein providing the plate further comprises electrically connecting the plate with the electronic circuit, the plate providing an electric path between the interconnection contact and the electronic circuit.

12. The method of claim 11, wherein configuring the plate to concentrate magnetic flux comprises configuring the plate to concentrate magnetic flux to a predetermined area suitable for including a sensing element for measuring magnetic field flux.

13. The method of claim 11, wherein providing an interconnection contact further comprises providing a masking layer for providing the at least one interconnection contact on a portion of the plate.

14. The method of claim 11, further comprising abutting the interconnection contact against the plate.

15. The method of claim 11, further comprising providing a seed layer on the substrate, subsequently providing the plate on the seed layer, where the seed layer is electrically conductive for electrically connecting the plate to the electronic circuit.

16. The method of claim 15, further comprising providing a masking layer at least partially over the substrate, before providing the seed layer.

17. The method of claim 11, further comprising providing a masking layer at least partially over the substrate, before providing the plate.

18. A semiconductor device including:
   an electronic circuit;
   an interconnection contact; and
   a plate configured to concentrate magnetic flux to a predetermined area, the plate being electrically conductive;
   wherein the plate is adapted to serve as diffusion barrier between the electronic circuit and the interconnection contact.

* * * * *